United States Patent
Hurd et al.

(10) Patent No.: US 11,515,178 B2
(45) Date of Patent: Nov. 29, 2022

(54) SYSTEM AND METHODS FOR WAFER DRYING

(71) Applicant: Tokyo Electron Limited, Tokyo (JP)

(72) Inventors: Trace Hurd, Austin, TX (US); Antonio Luis Pacheco Rotondaro, Austin, TX (US); Derek William Bassett, Austin, TX (US); Hitoshi Kosugi, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 352 days.

(21) Appl. No.: 16/820,344

(22) Filed: Mar. 16, 2020

(65) Prior Publication Data
US 2021/0287919 A1 Sep. 16, 2021

(51) Int. Cl.
*H01L 21/67* (2006.01)

(52) U.S. Cl.
CPC .... *H01L 21/67034* (2013.01); *H01L 21/6704* (2013.01); *H01L 21/67184* (2013.01)

(58) Field of Classification Search
CPC .......... H01L 21/67034; H01L 21/6704; H01L 21/67184; H01L 21/02057; H01L 21/02101
See application file for complete search history.

(56) References Cited

U.S. PATENT DOCUMENTS

| | | | | |
|---|---|---|---|---|
| 4,944,837 A * | 7/1990 | Nishikawa | ................ | G03F 7/36 430/323 |
| 5,369,891 A | 12/1994 | Kamikawa | | |
| 5,709,757 A * | 1/1998 | Hatano | ............... | C23C 16/4405 134/22.12 |
| 6,328,809 B1 | 12/2001 | Elsawy et al. | | |
| 6,430,840 B1 * | 8/2002 | Jung | ................. | H01L 21/02063 34/409 |
| 6,926,012 B2 | 8/2005 | Biberger et al. | | |
| 7,008,853 B1 * | 3/2006 | Dupont | ............ | H01L 21/31111 438/254 |
| 9,685,353 B2 * | 6/2017 | Ganesan | ........... | H01L 21/68785 |
| 2003/0045131 A1 * | 3/2003 | Verbeke | ............ | H01L 21/67167 438/795 |

(Continued)

FOREIGN PATENT DOCUMENTS

| EP | 833375 A3 | 5/2001 |
|---|---|---|
| JP | 2013012538 A | 1/2013 |

(Continued)

OTHER PUBLICATIONS

PCT International Search Report and Written Opinion, PCT application No. PCT/US2021/021735, dated Jul. 1, 2021, 9 pages.

*Primary Examiner* — Mohammed Shamsuzzaman
(74) *Attorney, Agent, or Firm* — Slater Matsil, LLP (57) ABSTRACT

In one example, a method for wafer drying includes providing a surface of a first wafer, the surface of the first wafer including a liquid to be removed with a drying process. The method further includes replacing the liquid with a first solid film in a first processing chamber, the first solid film covering the surface of the first wafer. The method further includes transferring the first wafer from the first processing chamber to a second processing chamber. The method further includes processing the first wafer in the second processing chamber by flowing a supercritical fluid through the second processing chamber, where the supercritical fluid removes the first solid film.

18 Claims, 6 Drawing Sheets

(56) References Cited

U.S. PATENT DOCUMENTS

| | | | |
|---|---|---|---|
| 2003/0172954 A1* | 9/2003 | Verhaverbeke | B08B 3/12 |
| | | | 134/147 |
| 2005/0121053 A1 | 6/2005 | Lee et al. | |
| 2006/0102208 A1* | 5/2006 | Jacobson | B08B 7/0021 |
| | | | 134/94.1 |
| 2012/0080059 A1* | 4/2012 | Lee | H01L 21/6708 |
| | | | 134/30 |
| 2014/0262024 A1 | 9/2014 | Cho et al. | |
| 2015/0287590 A1* | 10/2015 | Oh | H01L 21/02057 |
| | | | 438/689 |
| 2017/0250094 A1* | 8/2017 | Verhaverbeke | B08B 3/08 |
| 2017/0256397 A1* | 9/2017 | Goshi | H01L 21/02101 |
| 2017/0341113 A1 | 11/2017 | Kim et al. | |
| 2018/0158699 A1* | 6/2018 | Kitayama | F26B 5/005 |
| 2018/0358242 A1* | 12/2018 | Kim | H01L 21/68735 |

FOREIGN PATENT DOCUMENTS

| | | |
|---|---|---|
| JP | 5522124 B2 | 6/2014 |
| KR | 20130007418 A | 1/2013 |
| KR | 20160095657 A | 8/2016 |
| KR | 101824809 B1 | 2/2018 |
| WO | 2006088560 A1 | 8/2006 |
| WO | 2006124321 A2 | 11/2006 |

\* cited by examiner

SYSTEM AND METHODS FOR WAFER DRYING

TECHNICAL FIELD

The present invention relates generally to a system and method for wafer drying, and, in particular embodiments, to system and method for wafer drying using supercritical fluids.

BACKGROUND

The manufacturing of semiconductor wafers often involves several process steps. Many of those processing steps include removal of by-product chemical species used, for example, in a wet cleaning process. Often deionized water is used as a final rinse step of a wafer cleaning process to remove the cleaning liquids. However, even the rinsing liquid has to be removed prior to further processing. Therefore, wafers are dried to remove traces of the rinsing liquid. However, with scaling of features to ever smaller geometries, drying techniques are being challenged to not damage the features during the drying.

To overcome these challenges, one particular method was developed that involved displacing the rinsing liquid on the surface of the wafer with isopropyl alcohol (IPA). This IPA is then removed using a supercritical drying process, in which the IPA covered wafer is exposed to supercritical carbon dioxide, which removes the IPA.

SUMMARY

In accordance with an embodiment of the present invention, a method for wafer drying includes providing a surface of a first wafer, the surface of the first wafer including a liquid to be removed with a drying process. The method further includes replacing the liquid with a first solid film in a first processing chamber, the first solid film covering the surface of the first wafer. The method further includes transferring the first wafer from the first processing chamber to a second processing chamber. The method further includes processing the first wafer in the second processing chamber by flowing a supercritical fluid through the second processing chamber, where the supercritical fluid removes the first solid film.

A method for wafer drying includes providing a surface of a first wafer, the surface of the first wafer including a liquid to be removed with a drying process; forming a first solid film covering the surface of the first wafer in a first processing chamber; flowing a fluid within a second processing chamber. The method further includes pressurizing the fluid to flow through the second processing chamber in a supercritical phase; and removing, in the second processing chamber, the first solid film from the surface of the first wafer by sublimating the first solid film into the supercritical phase of the fluid.

A process equipment includes a processing chamber; a fluid inlet into the processing chamber; a fluid outlet out of the processing chamber; a support for holding a wafer to be dried; and control circuit configured to apply a pressurization cycle to pressurize a fluid in the processing chamber to become a supercritical fluid.

BRIEF DESCRIPTION OF THE DRAWINGS

For a more complete understanding of the present invention, and the advantages thereof, reference is now made to the following descriptions taken in conjunction with the accompanying drawings, in which:

FIGS. 1A-1C illustrate cross-sectional representations of a general process flow for a wafer drying process in accordance with embodiments of the present invention, wherein FIG. 1A illustrates the formation of a solid film on a substrate after wet processing, wherein FIG. 1B illustrates the transfer of the substrate, and wherein FIG. 1C illustrates exposing the solid film to a supercritical fluid;

FIGS. 2A-2F show cross-sectional representations of a semiconductor wafer comprising high aspect ratio (HAR) structures during various stages of drying in accordance with an embodiment of the invention, wherein FIG. 2A illustrates the wafer with a solid film, wherein FIG. 2B illustrates the injection of a fluid into the processing chamber, wherein FIG. 2C illustrates the progressive removal of the solid film in the fluid, wherein FIG. 2D illustrates a more progressive removal stage of the solid film as it dissolves into the fluid, wherein FIG. 2E illustrates the complete removal of the solid film, and wherein FIG. 2F illustrates the wafer after the drying all in accordance with an embodiment of the present invention;

FIGS. 4A-4B illustrates a schematic diagram representing various components of a supercritical drying system described in various embodiments, wherein FIG. 4A illustrates a system component schematic while FIG. 4B illustrates a fluid supply schematic.

The drawings are not necessarily drawn to scale. The drawings are merely representations, not intended to portray specific parameters of the invention. The drawings are intended to depict only specific embodiments of the inventions, and therefore should not be considered as limiting in scope. In the drawings, like numbering represents like elements.

DETAILED DESCRIPTION OF ILLUSTRATIVE EMBODIMENTS

The method and using of various embodiments of a wafer drying system are discussed in detail below. However, it should be valued that the various embodiments detailed herein may be applicable in a wide variety of disciplines. Embodiments may also be applied in other contexts outside of wafer drying. The specific embodiments described herein are merely illustrative of specific ways to make and use various embodiments, and should not be construed in a limited scope.

Conventional methods that used supercritical drying to remove isopropyl alcohol (IPA) coated wafer surfaces have many process related limitations. IPA is susceptible to de-wetting and spilling when the wafer is transported to the drying chamber. Additionally, the high vapor pressure of the IPA may result in premature drying, leading to the collapse of the topographical features on the surface of the wafer.

Embodiments of the present invention overcome these limitations by replacing drying liquids such as IPA or rinsing liquid such as DI water with a solid film that covers the entire surface of the wafer. The solid film is then directly removed in a drying chamber by using a supercritical drying process. An embodiment of the method will be described using FIGS. 1A-1C along with FIGS. 2A-2F. An alternative embodiment of the method and drying chamber will be described using FIG. 3. A system for supercritical wafer drying for implementing the embodiments of FIGS. 1A-1C, 2A-2F, 3 will be described using FIG. 4.

Figure 1A:
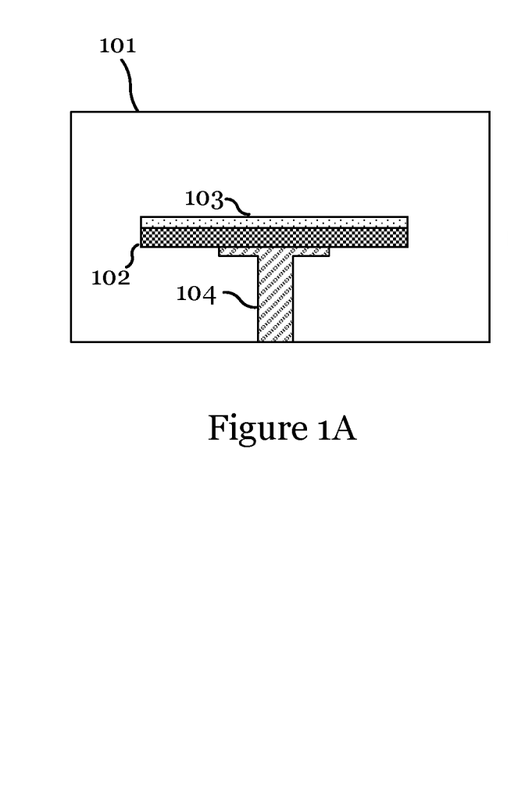
Figure 1B:
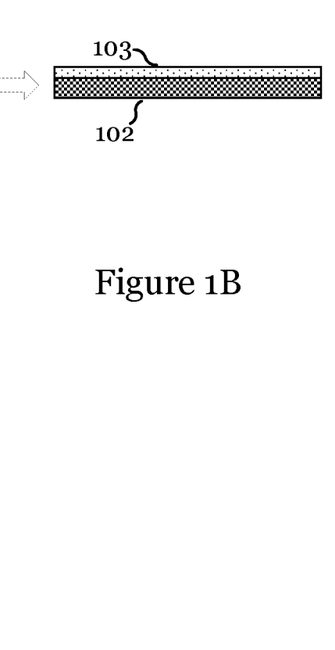
Figure 1C:
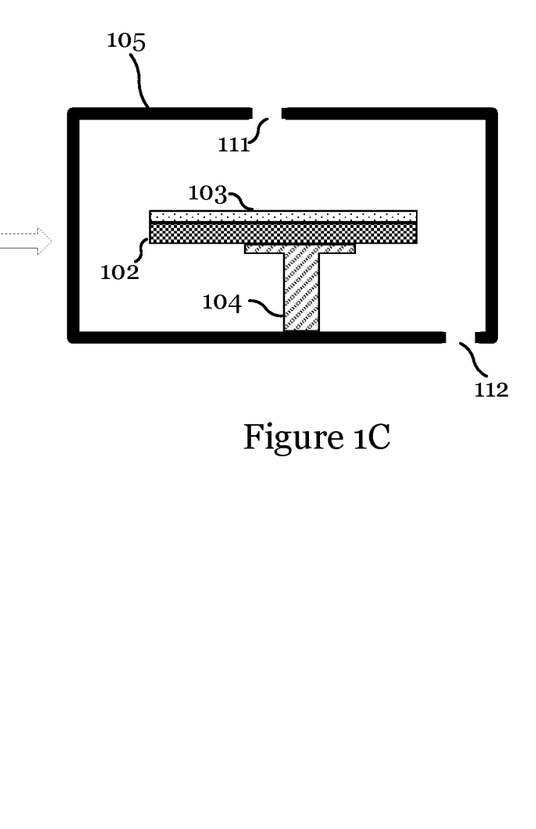

FIGS. 1A-1C illustrate cross-sectional representations of a general process flow for a wafer drying process in accordance with embodiments of the present invention.

The embodiments presented herein will elaborate upon a drying technique in which a wafer 102 is placed into a processing chamber in which a solid film is formed on the surface of the wafer. As will be described in greater detail later, the solid film serves as a sacrificial layer to protect the structures on the surface of the wafer 102. Once the formation of the solid film is complete, the wafer 102 is then transferred to a second processing chamber in which a supercritical removal technique is implemented to dissolve away the solid film, thus exposing the top surface structures of the wafer 102.

Prior to the initial stage illustrated in FIG. 1A, the wafer 102 may have undergone a wet cleaning process to remove any lingering process chemicals from previous wafer fabrication steps. The wet clean may take place in a cleaning process chamber, e.g., in one embodiment may be the first processing chamber 101, which can be configured to handle single or multiple wafers. The cleaning process chamber may operate, for example, by spin cleaning. While the wafer 102 is spinning, a nozzle arm which supplies cleaning material may be advanced near the upper side of the rotating wafer 102. The nozzle arm may supply, in a predetermined order, e.g., a chemical liquid followed by a rinse liquid. The backside of the wafer 102 may also undergo a similar cleaning process in which a chemical liquid, followed by a rinse liquid, is used. For example, in one embodiment of the cleaning process, a SC1 liquid (i.e., a mixture of ammonia hydroxide and hydrogen peroxide), which is an alkaline chemical liquid, may first be used to remove particles and organic contaminants. Then a rinse operation may be performed using a rinse liquid, such as deionized water (DIW). A second cleaning process may be performed sequentially in some embodiments. In the next cleaning phase, any native oxide film that may be present on the wafer 102 is removed by an aqueous solution of diluted hydrofluoric acid (DHF), which is an acidic chemical liquid. Next, an additional rinse cleaning is performed, again with DIW.

Once the wet cleaning process is completed, all the cleaning liquids are drained from the cleaning process chamber through a drain port, usually provided at a bottom location within the cleaning process chamber. Furthermore, the atmosphere within the cleaning process chamber is exhausted from an exhaust port, e.g., provided at a bottom location within the cleaning process chamber. Meanwhile, the rotation of the wafer holding mechanism 104 is brought to a gradual stop.

After completion of the wet cleaning process described above, the wafer 102 has to be dried to remove the rinsing liquids. If the cleaning process chamber is configured to perform additional processing steps, the wafer 102 may remain in the same chamber as preparation is made for the next processing steps. However, in the event the cleaning process chamber is not configured to perform the next processing steps, the wafer 102 may be transferred to a different processing chamber.

Referring now to FIG. 1, the schematic illustrates the formation of a solid film on the surface of a wafer 102, after wet cleaning and rinsing. At this stage of processing, the wafer 102 is placed into a first processing chamber 101, where it securely rests upon a wafer holding mechanism 104. Within this first processing chamber 101, a solid film 103 is formed on the top surface of the wafer 102, such that it completely covers the entirety of structures on the surface of the wafer 102.

The first processing chamber 101 may be described as a unit that holds a wafer 102 substantially horizontal with the wafer holding mechanism 104 disposed in an inner chamber that forms a processing space.

The wafer holding mechanism 104 may comprise a rotating chuck that rotates the wafer 102 around a vertical axis. In other embodiments, the first processing chamber 101 may comprise a fixed chuck, a jig with various pins or clips used to secure and mount the wafer 102; or possibly a plate or tray where the wafer 102 may rest during various processing steps.

In various embodiments of the invention, the wafer 102 may comprise a semiconductor substrate, such as silicon. Or in other embodiments, any other type of semiconductor body, such as silicon on insulator (SOI), as well as compound semiconductors. Furthermore, the wafer 102 may comprise a semiconductor substrate having multiple processed layers, wherein each layer may be comprised of different compositions of semiconductor material known within the art. Additionally, the top-most layer of the wafer 102 may comprise surface features, such as high aspect ratio (HAR) structures.

According to embodiments of the invention, the solid film 103 is formed on the top-most surface of the wafer 102 after the wet processing steps. The solid film 103 may be a sacrificial film that provides temporary physical support for surface features (i.e., HAR structures) on the wafer 102 during periods of transport from one processing chamber to another. For example, the rigidity of the solid film 103 coats the surface features in efforts to help prevent the surface features (i.e., HAR surfaces) from collapsing upon one another during various modes of wafer transport.

When a liquid wets a solid, a pressure difference (usually referred as Laplace pressure) builds up across the interface, which depends on the surface tension and the contact angle between the liquid and solid. During wafer drying (removal of the liquid) from the wafer surface, this Laplace pressure can build up more in certain regions such as HAR structures causing damage to the features (e.g., pattern collapse). Embodiments of the invention overcome this by avoiding a liquid to vapor transformation as in conventional drying techniques.

Rather, embodiments of the present invention remove the solid film 103 by converting (e.g., dissolving or melting) the solid film 103 directly into a supercritical fluid. In various embodiments, the material of the solid film 103 and a fluid are selected such that the solid film 103 transforms to a supercritical phase. In other words, in various embodiments, the composition of the solid film 103 is configured such that when the solid film 103 is exposed to a fluid, the solid film 103 forms a supercritical fluid, which eliminates the surface tension between the solid film 103 and the underlying structures of the wafer 102. This causes the solid film 103 to sublime (or remove) into the fluid, which can then be removed from the process chamber.

Accordingly, in one or more embodiments, the solid film 103 is soluble in a supercritical fluid comprising carbon dioxide ($scCO_2$). In other words, in one embodiment, the solid film 103 forms a supercritical phase with carbon dioxide ($CO_2$), such that the composition of materials within the solid film 103 dissolves into a gas that is miscible with $scCO_2$. For example, the solid film 103 may have a material composition which comprises greater than 85% isopropyl alcohol (IPA), since that concentration makes the solid film easily soluble in a supercritical fluid such as $scCO_2$. In one or more embodiments, the solid film 103 may comprise polymeric materials, such as polystyrene, polyethylene, polypropylene, and polymers with carbonyl groups.

The solid film 103 may be formed on the surface of the wafer 102 through a multitude of fabrication techniques, such as spin casting, coating, deposition, and other processes known to person having ordinary skill in the art. For example, the solid film 103 may be initially cast onto the surface of the wafer 102 through a nozzle that first dispenses the polymeric material onto a center location of the wafer 102. The wafer 102 is then spun, via rotation of the wafer holding mechanism 104 coupled within the first processing chamber 101, so as to spread the polymeric material across the wafer. Once the polymeric material is spread across the wafer 102, a designated spin speed may be implemented to achieve a desired thickness of the solid film 103. The thickness of the solid film 103 can range from a few tens of nanometer to a few microns, depending on the height of the surface features (i.e., HAR structures) on the wafer 102.

In various embodiments, the thickness of the solid film 103 may be selected to at least cover the top of the surface features. In one or more embodiments, the thickness of the solid film 103 is at least 10% more than a thickness of the tallest structure on the wafer 102 so that all features on the wafer 102 are covered by the solid film 103. Once the desired thickness of the solid film 103 is achieved, the polymeric material may undergo a soft baking or curing process in order to solidify and harden the material.

The use of a solid material, such as the solid film 103, in the place of more traditional materials (such as liquids, like IPA) used in conventional supercritical drying provides a more mechanically stable material for processing. Advantageously, a solid film 103 is much easier to transport at normal robot speeds, in comparison to a traditional liquid film. For example, in comparison to traditional methods that use liquids, the solid film 103 can be transported at a faster rate thereby reducing latency but at the same time does not pose the risk of spilling from (or de-wetting) the surface of the wafer 102. Additionally, due to the comparatively low vapor pressure of the solid film 103, there is no risk of film loss due to evaporation, as in the case with traditional materials. Consequently, there is no risk of unintended surface exposure due to drying during ramps in temperature or pressure. Accordingly, embodiments of the present invention can reduce pattern collapse of surface features, like HAR structures, especially around the edge of the wafer 102.

As next illustrated in FIG. 1B, the wafer 102 comprising a solid film 103 is transported for additional processing. The wafer 102 may be transferred using a wafer delivery apparatus such as a robot coupled to a fork, or a plate that securely holds the wafer 102 in position while under transport. For example, the wafer 102 may be delivered to a second processing chamber 105, as further described using FIG. 1C.

Referring next to FIG. 1C, the wafer 102 comprising the solid film 103 is placed in the second processing chamber 105, such as a supercritical drying (SCD) chamber, where it undergoes a complete removal of the solid film 103.

The second processing chamber 105 may be first ramped to the processing condition. For example, during this time, the wafer 102 as well as the second processing chamber 105 may be heated to reach the processing temperature. Similarly, the second processing chamber 105 may be pressurized to the specific pressure. Advantageously, during this time, the solid film 103 continues to cover the surface of the wafer 102 without causing inadvertent exposure of features on the wafer surface.

While in the second processing chamber 105, the solid film 103 on the surface of the wafer 102 is brought into contact with a supercritical fluid, which in one embodiment may comprise carbon dioxide ($scCO_2$). The fluid is injected into the second processing chamber 105 and pressurized to become a supercritical fluid, which then makes contact with the solid film 103 on the surface of the wafer 102. While in the presence of the supercritical fluid, the solid film 103 gradually dissolves away, leaving the wafer 102 "dried" and the newly-exposed surface features (i.e., HAR structures) ready for additional processing.

In one embodiment, the supercritical fluid predominately comprises supercritical carbon dioxide ($scCO_2$), which advantageously has good chemically stability, reliability, low cost, non-toxic, non-flammable, and easily available. All of these characteristics help make $scCO_2$ a desirable candidate for various semiconductor manufacturing processes, in particular wafer drying.

Within the second processing chamber 105, a fluid supply header delivers the supercritical fluid to the main body of the second processing chamber 105 through the inlet in. During processing (i.e., removal of the solid film 103), the fluid supply header delivers the supercritical fluid at a controlled, e.g., laminar flow rate. While operating at a laminar flow rate, the supercritical fluid may flow directly from the fluid supply header toward the top surface of the solid film 103. On its journey down towards the surface of the wafer 102, the supercritical fluid penetrates through the solid film 103, gradually removing it in the process. Details of this process will be described in a later section.

At the completion of processing, a fluid discharge header guides the supercritical fluid from the main body of the second processing chamber 105 to a region outside of the main body through outlet 112. In this outside region, the supercritical fluid is discharged from the second processing chamber 105. The discharged supercritical fluid may also comprise remnants of the dissolved solid film 103.

FIGS. 2A-2F show cross-sectional representations of a drying process flow as a solid film 103 is removed from the surface of a wafer 102 comprising high aspect ratio (HAR) structures 201 in accordance with an embodiment of the invention. The following figures offer a more detailed account of the various wafer-level process stages that may take place within the second processing chamber 105 described in FIG. 1C above.

Figure 2A:
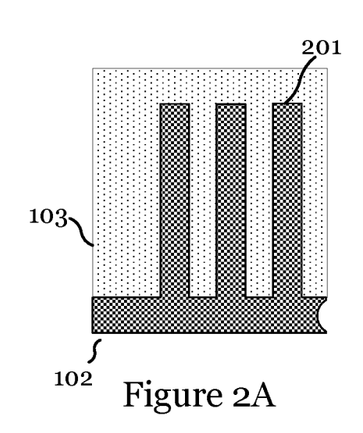

Referring now to FIG. 2A, at this stage of processing, a wafer 102 comprising HAR structures 201 is surrounded by a solid film 103. As described earlier, the solid film 103 may be a sacrificial layer that offers temporary protection to surface features, such as the HAR structures 201 depicted in FIG. 2A. The solid film 103 helps ensure the HAR structures 201 do not succumb to pattern collapse, primarily seen around the edges of the wafer 102 during transport after a wet cleaning process.

According to embodiments of the invention, depending on the desired application, the aspect ratio (width to height) of the HAR structures 201, in one example, may range from 1:5 to 1:20, or 1:5 to 1:100. It is noted that embodiments of this application apply to aspect ratios not specifically addressed herein.

In embodiments of the invention, the HAR structures 201 may be part of a pattern of a device being fabricated or an intermediate structure during fabrication. In various embodiments, the HAR structures 201 may be fabricated through standard semiconductor manufacturing techniques such as deep reactive ion etching (DRIE) or other processes known to persons having ordinary skill in the art.

The HAR structures 201 may comprise patterns of materials such as silicon, silicon carbide, gallium nitride, silicon oxide, silicon nitride, metal lines or vias, metal oxides (MOx), metal nitrides (MNx), and metal oxynitrides, where the "M" represents an elemental metal such as aluminum, copper, hafnium, titanium, tantalum, tungsten, molybdenum, and others.

Figure 2B:
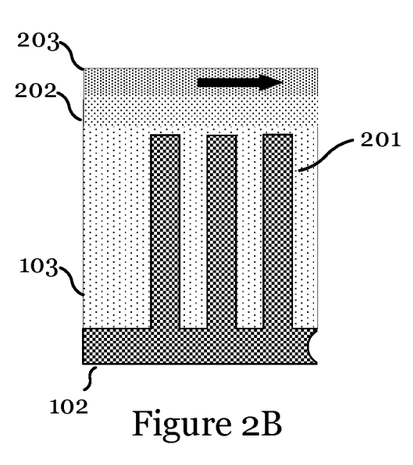

As next illustrated in FIG. 2B, a fluid 203 is introduced into the pressure sealed second processing chamber 105, under a laminar flow rate, where it is able to reach a supercritical phase due to set process parameters of the system (e.g., pressure and temperature). As the fluid 203 penetrates into the solid film 103, a mixture 202 is formed at the interface between the fluid 203 and top portion of the solid film 103. The mixture 202 comprises the fluid 203 and the solid film 103.

In various embodiments, the solid film 103 is removable by the fluid 203 and soluble in the fluid 203. In one embodiment, the mixture 202 also forms a supercritical phase and therefore separates out from the solid film 103 and is incorporated into the flowing fluid 203. In another embodiment, the solid film 103 dissolves or sublimates in the fluid 203 and thus directly transitions into a gaseous phase. For example, if the solid film 103 comprises a polymeric substance that is miscible in the fluid 203, then the fluid 203 can be used to dissolve the polymeric substance away until it is fully removed from the surface of the wafer 102. In a different embodiment, the solid film 103 melts into the fluid 203 and is removed by the fluid 203. In another example, the fluid 203 may be used to saturate the polymeric substance similar to a solvent.

Advantageously, during the removal of the solid film 103, the stresses from surface tension between the mixture 202 and the underlying HAR structures 201 is minimal causing no damage to these structures.

Figure 2C:
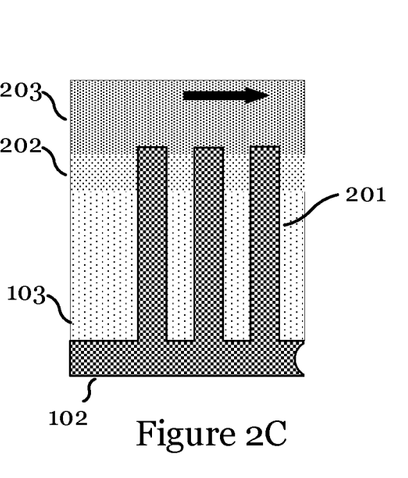

FIG. 2C shows the progressive removal of the solid film 103 as it dissolves into the fluid 203. As the solid film 103 depletes, the mixture 202 penetrates deeper into the solid film 103. The mixture 202 comprises a combination of material from the dissolving solid film 103 as well as the fluid 203.

Figure 2D:
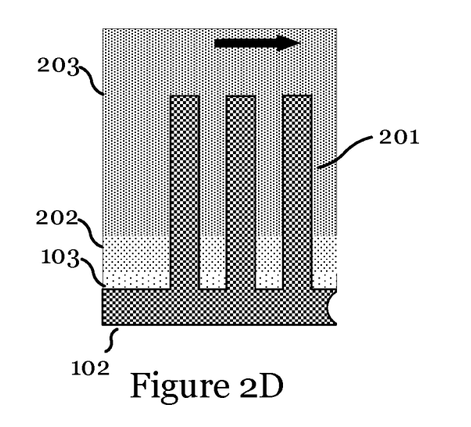

Referring next to FIG. 2D, the schematic shows a more progressive removal stage of the solid film 103 as it continues to dissolve into the fluid 203. At this stage, the second processing chamber 105, shown above and discussed in FIG. 1C, is predominately filled with the fluid 203. Additionally, the majority of the solid film 103 has been removed as it is consumed by the fluid 203. Moreover, the mixture 202 has penetrated further past the HAR structures 201 and deeper into the solid film 103.

Figure 2E:
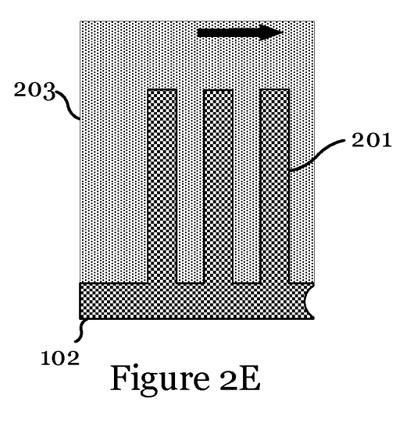

As shown in FIG. 2E, the solid film 103 is completely removed. As the schematic shows, the fluid 203, which has fully encompassed the second processing chamber 105, is completely surrounding the HAR structures 201. Subsequently, the solid film 103 is no longer present on the surface of the wafer 102. Likewise, the mixture 202 is also flushed out along with the flowing fluid 203.

Figure 2F:
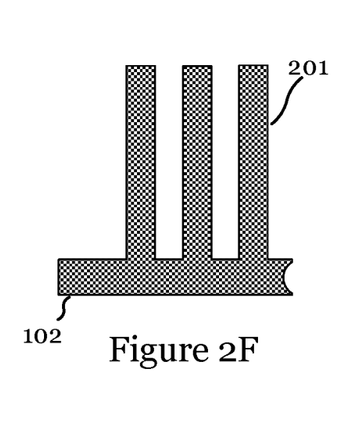

FIG. 2F shows a schematic of the wafer 102, comprising the HAR structures 201, once the fluid 203 is purged from the second processing chamber 105 (e.g., supercritical drying chamber). With the second processing chamber 105 now purged of any lingering gases, the HAR structures 201 are exposed and ready for subsequent processing. At this final stage, the wafer 102 is removed from the second processing chamber 105 after depressurizing the chamber and stopping the flow of the fluid 203 and the wafer 102 may undergo subsequent processing as in conventional semiconductor processing.

The total processing time of a wafer 102 in the second processing chamber 105 may range anywhere from roughly 70-180 seconds. This time scale may be dependent upon the type of material comprising the solid film 103. Likewise, the time scale may also need to be adjusted based upon the desired thickness needed for the solid film 103 to fully cover all of the HAR structures 201 present on the surface of the wafer 102. Moreover, the solid film 103 may require more time to equilibrate within the second processing chamber 105 before the fluid 203 is delivered into the system.

Figure 3:
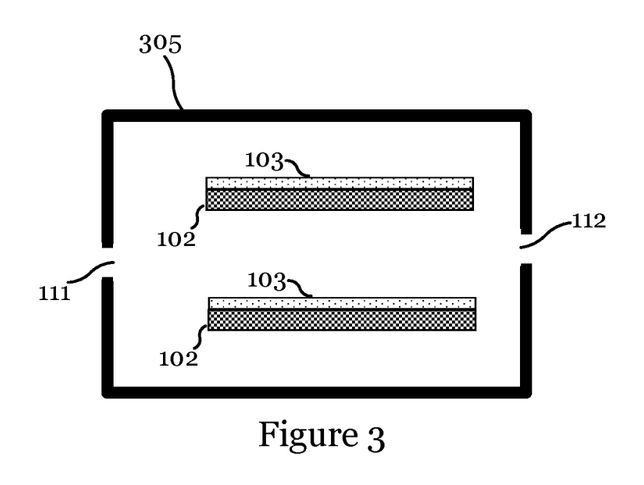
FIG. 3 is a cross-sectional representation of a batch supercritical drying process chamber all in accordance with an embodiment of the present invention.

FIG. 3 is a cross-sectional representation of a higher throughput batch processing chamber 305 for supercritical drying in accordance with another embodiment of the invention.

In this embodiment of the invention, the batch processing chamber 305 is configured to process multiple wafers 102. By processing multiple wafers 102, total processing time per wafer can be reduced significantly, thereby reducing production costs. For example, in the illustration, the batch processing chamber 305 is configured to support two wafers at the same time, and therefore increases the throughput by two times. However, the batch processing chamber 305 includes modifications over the previously illustrated second processing chamber 105 for supporting multiple wafers.

In various embodiments, the batch processing chamber 305 is equipped with a modified mechanically handling system that may comprise multiple wafer holding mechanisms 104. Furthermore, the wafer holding mechanisms 104 are designed to reduce wafer to wafer variations and therefore all of the wafers 102 experience an identical process environment, for example, similar flow rate, partial pressures of the fluid 203 at the wafer surface, and others. In one embodiment, the batch processing chamber 305 is larger than the second processing chamber 105 and therefore may take longer for stabilization (pressurization). If the batch processing chamber 305 is too much larger, then any advantage gained by simultaneous processing may be negated by the pressurization and depressurization times.

Figure 4A:
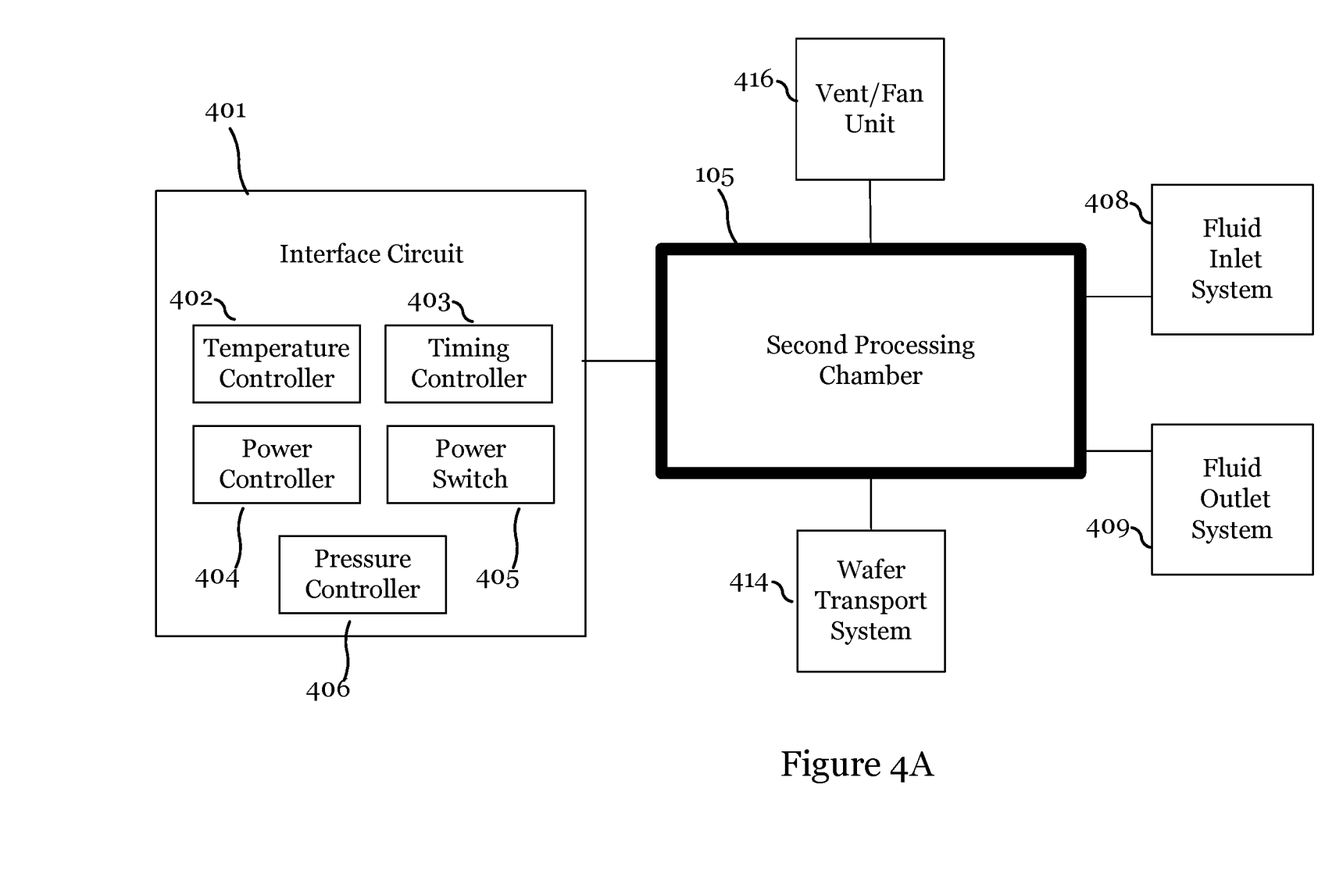
Figure 4B:
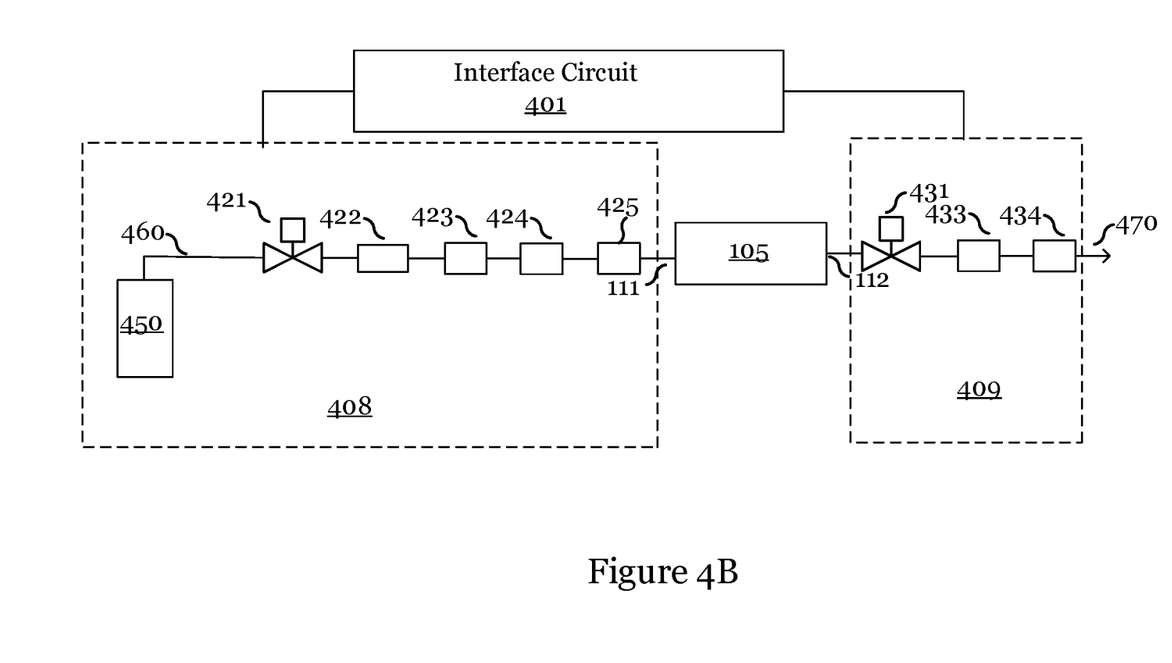

FIGS. 4A-4B illustrates a schematic diagram representing various components of a supercritical drying system such as the second processing chamber 105/batch processing chamber 305 described in various embodiments, wherein FIG. 4A illustrates a system component schematic while FIG. 4B illustrates a fluid supply schematic.

In various embodiments of the invention, the supercritical drying system may comprise an interface circuit 401 coupled to the second processing chamber 105 (or batch processing chamber 305). The interface circuit 401 may comprise a temperature controller 402 for controlling the temperature of the wafer within the second processing chamber 105. In embodiments of the invention, the temperature controller 402 may be used to allow the user to select a desired temperature for the intended process. The system may include a timing controller 403 for controlling the time spent by the wafer within the processing chamber. The timing controller 403 may also control timing cycles for pressurization and temperature cycles. In various embodiments of the invention, the timing controller 403 may also be used to allow the user to set and/or monitor a desired time for the intended process.

The system may also include a pressure controller 406 to monitor the pressure within the chamber, which may be used by the timing controller 403 and the temperature controller 402 to adjust the pressure and/or temperature within the chamber. In some embodiments, the circuitry of the temperature controller 402, the timing controller 403 and the pressure controller 406 may be integrated in a single chip. A power controller 404 either singly or in conjunction with the timing controller 403 may supply power to the various components of the system. A power switch 405 may provide manual override ability.

In embodiments of the invention, the interface circuit 401 may also comprise a display and a graphical user interface (GUI), such as a digital display touch screen for user input for various process-related functions performed by the second processing chamber 105. The display may also provide status indicators related to each process performed by the second processing chamber 105. This would allow the user to monitor the real-time status of the set process parameters.

In embodiments of the invention, the power switch 405 allows the user to turn on or off (i.e., power down) the second processing chamber 105. The power switch 405 may also include an indicator that may allow the user to determine whether the system is in an operational mode, stand-by mode, turned off mode, or other modes.

In other embodiments of the second processing chamber 105, the additional coupled components may comprise a vent/fan unit 416, a fluid inlet system 408, a fluid outlet system 409, and a wafer transport system 414, which may include the wafer holding mechanism 104 (described above).

In various embodiments, the vent/fan unit 416, which may be comprised within the second processing chamber 105, may help evacuate gases from the main compartment of the second processing chamber 105 or to help regulate the internal temperature, e.g., by avoiding hot spots or overheating. The vent/fan unit 416 may be located at the back or bottom of the second processing chamber 105 in one embodiment.

In various embodiments of the invention, the fluid inlet system 408 and the fluid outlet system 409, coupled to the second processing chamber 105, offer a pathway for the gases such as carbon dioxide to enter and leave the main compartment of the second processing chamber 105.

As illustrated in FIG. 4B, the fluid inlet system 408 may comprise a fluid supply source 450 for supplying the raw material of the fluid 203 at a pressure higher than the atmospheric pressure into the second processing chamber 105, a fluid supply passage 460 connecting the fluid supply source to the second processing chamber 105. The fluid inlet system 408 may also comprise a flow control unit with an on-off valve 421 disposed in the fluid supply path. The on-off valve 421 adjusts the on and off of the supply of the fluid 203 (e.g., in a supercritical state) from the fluid supply source 450, and causes the fluid 203 to flow onto the second processing chamber 105 when the on-off valve 421 is open and does not cause the fluid 203 to flow onto the second processing chamber 105 when the on-off valve 421 is closed. For example, when the on-off valve 421 is open, the fluid 203 having a high pressure of about 15 MPa to 30 MPa may be supplied from the fluid supply source 450 to the supply line via the on-off valve 421.

The fluid inlet system 408 may also comprise heaters 422 for heating the fluid 203. The fluid inlet system 408 may also comprise a plurality of sensors 423 for sensing the temperature and pressure. The fluid inlet system 408 may also comprise a pressure reducing valve, e.g., an orifice 424 for regulating the pressure of the fluid 203 (e.g., in a supercritical state) being supplied from the fluid supply source 450. The fluid inlet system 408 may also comprise a filter 425 to remove any foreign matter contained in the fluid 203 (e.g., in a supercritical state) being sent from the orifice 424 and output a clean fluid 203 (e.g., in a supercritical state) into inlet in of the second processing chamber 105.

The fluid outlet system 409 may comprise a discharge control valve 431 that adjusts the on and off of the supply of the fluid 203 from the second processing chamber 105, and causes the fluid 203 to discharge from the second processing chamber 105 when the discharge control valve 431 is open and does not cause the fluid 203 to discharge from the second processing chamber 105 when the discharge control valve 431 is closed.

The fluid outlet system 409 may also comprise a plurality of sensors 433 for sensing the temperature and pressure of the fluid being discharged through the downstream discharge path 470. The fluid outlet system 409 may also comprise a pressure reducing valve, e.g., an orifice 434 for regulating the pressure of the fluid 203 being discharged from the second processing chamber 105. In various embodiments, the fluid inlet system 408 and the fluid outlet system 409 may be controlled by the interface circuit 401 using the components described using FIG. 4A. In various embodiments, the fluid inlet system 408 and the fluid outlet system 409 may comprise other components as known to a person having ordinary skill in the art. In one embodiment, inlets for the fluid inlet system 408 and outlets for the fluid outlet system 409 may be located at the bottom, or near the back, of the second processing chamber 105.

Figure 5:
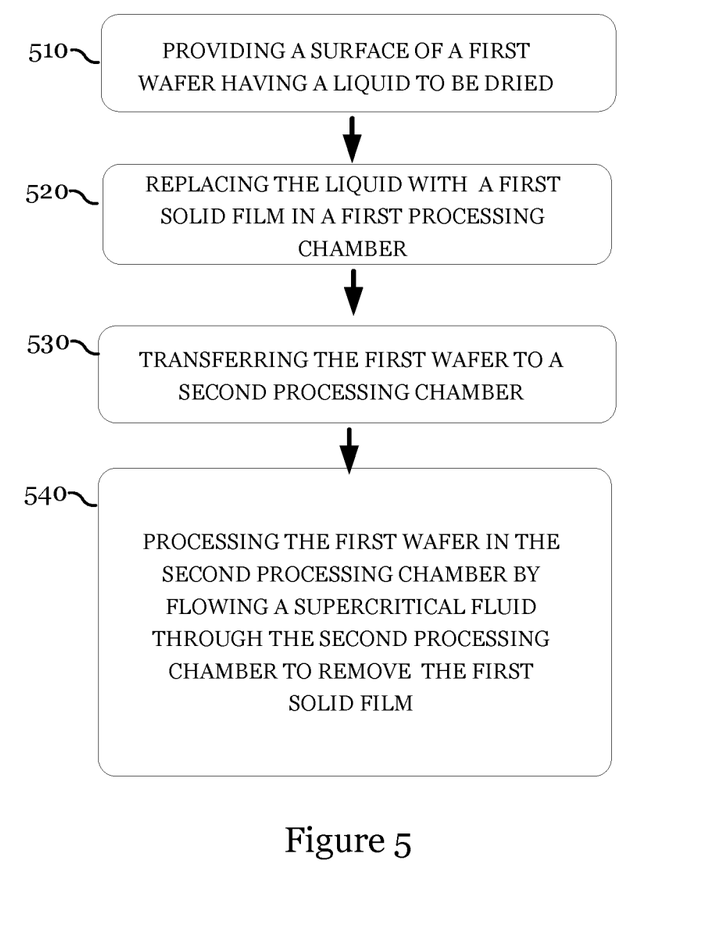
FIG. 5 illustrates a flow chart illustrating a processing procedure for a wafer drying process all in accordance with an embodiment of the present invention.

FIG. 5 illustrates a flow chart illustrating a processing procedure for a wafer drying process by removing a liquid to be removed by forming a solid film all in accordance with an embodiment of the present invention.

Accordingly, as illustrated for example in FIGS. 1A-1C and 2A-2F above, a method for wafer drying comprises providing a surface of a wafer 102, where the surface of the wafer comprises a liquid to be removed with a drying process (step 510). In a first processing chamber 101, the method includes replacing the liquid to be removed with a first solid film 103, where the first solid film 103 covers the surface of the wafer 102 (step 520). The method further includes transferring the wafer 102 from the first processing chamber 101 to a second processing chamber 105 (step 53o). The method may further include processing the wafer 102 in the second processing chamber 105 by flowing a fluid 203 through the second processing chamber 105 (step 540), wherein the fluid 203 removes the first solid film 103.

Example embodiments of the invention are summarized here. Other embodiments can also be understood from the entirety of the specification as well as the claims filed herein.

Example 1. A method for wafer drying includes providing a surface of a first wafer, the surface of the first wafer including a liquid to be removed with a drying process. The method further includes replacing the liquid with a first solid film in a first processing chamber, the first solid film covering the surface of the first wafer. The method further includes transferring the first wafer from the first processing chamber to a second processing chamber. The method further includes processing the first wafer in the second processing chamber by flowing a supercritical fluid through the second processing chamber, where the supercritical fluid removes the first solid film.

Example 2. The method of example 1, further including: before replacing the liquid with the first solid film, performing a rinsing process on a plurality of features disposed at the surface of the wafer.

Example 3. The method of one of examples 1 or 2, where the liquid to be removed is a rinsing liquid from the rinsing process.

Example 4. The method of one of examples 1 to 3, further including removing a rinsing liquid from the rinsing process by treating the wafer with isopropyl alcohol, where the liquid to be removed is the isopropyl alcohol.

Example 5. The method of one of examples 1 to 4, where the surface of the wafer includes high aspect ratio features.

Example 6. The method of one of examples 1 to 5, where the first solid film surrounds and covers the high aspect ratio features.

Example 7. The method of one of examples 1 to 6, further including: providing a surface of a second wafer, the surface of the second wafer including the liquid to be removed with the drying process; in the first processing chamber, replacing the liquid with a second solid film, the second solid film covering the surface of the second wafer. The method further includes transferring the second wafer from the first processing chamber to a second processing chamber; and processing the second wafer in the second processing chamber by flowing a supercritical fluid through the second processing chamber, where the supercritical fluid removes the second solid film.

Example 8. The method of one of examples 1 to 7, where the first wafer and the second wafer are simultaneously processed in the second processing chamber.

Example 9. A method for wafer drying includes providing a surface of a first wafer, the surface of the first wafer including a liquid to be removed with a drying process; forming a first solid film covering the surface of the first wafer in a first processing chamber; flowing a fluid within a second processing chamber. The method further includes pressurizing the fluid to flow through the second processing chamber in a supercritical phase; and removing, in the second processing chamber, the first solid film from the surface of the first wafer by sublimating the first solid film into the supercritical phase of the fluid.

Example 10. The method of example 9, further including: before forming the first solid film, performing a rinsing process step on a plurality of features disposed at the surface of the first wafer.

Example 11. The method of one of examples 9 or 10, where the liquid to be removed is a rinsing liquid from the rinsing process.

Example 12. The method of one of examples 9 to 11, further including removing a rinsing liquid from the rinsing process by treating the wafer with isopropyl alcohol, where the liquid to be removed is the isopropyl alcohol.

Example 13. The method of one of examples 9 to 12, where the surface of the first wafer includes high aspect ratio features.

Example 14. The method of one of examples 9 to 13, where the first solid film surrounds and covers the high aspect ratio features.

Example 15. The method of one of examples 9 to 14, further including: providing a surface of a second wafer to be dried; forming a second solid film covering the surface of the second wafer in the first processing chamber. The method further includes removing the second solid film from the surface of the second wafer by sublimating the second solid film into the supercritical phase of the fluid.

Example 16. The method of one of examples 9 to 15, where the first wafer and the second wafer are simultaneously processed in the second processing chamber.

Example 17. The method of one of examples 9 to 16, further including: processing the surface of the first wafer with a liquid before forming the first solid film, where forming the first solid film replaces the liquid with the first solid film.

Example 18. A process equipment includes a processing chamber; a fluid inlet into the processing chamber; a fluid outlet out of the processing chamber; a support for holding a wafer to be dried; and control circuit configured to apply a pressurization cycle to pressurize a fluid in the processing chamber to become a supercritical fluid.

Example 19. The process equipment of example 18, where the control circuit includes: a temperature controller to monitor and control the temperature of the fluid; and a pressure controller to monitor and control the pressure of the fluid.

Example 20. The process equipment of one of examples 18 or 19, where the support is configured to hold a plurality of wafers, where the control circuit is configured to provide an identical process environment to each of the plurality of wafers during the pressurization cycle.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for wafer drying, the method comprising:
providing a surface of a first wafer with a plurality of high aspect ratio features disposed at the surface of the first wafer, the surface of the first wafer comprising a liquid to be removed with a drying process;
in a first processing chamber, replacing the liquid with a first solid film, the first solid film covering the surface of the first wafer;
transferring the first wafer from the first processing chamber to a second processing chamber;
processing the first wafer in the second processing chamber by flowing a supercritical fluid through the second processing chamber, wherein the supercritical fluid removes the first solid film progressively;
purging the supercritical fluid from the second processing chamber; and
removing the first wafer from the second processing chamber after depressurizing the second processing chamber and stopping the flow of the supercritical fluid to the second processing chamber.

2. The method of claim 1, further comprising:
before replacing the liquid with the first solid film, performing a rinsing process on the plurality of high aspect ratio features disposed at the surface of the first wafer.

3. The method of claim 2, wherein the liquid to be removed is a rinsing liquid from the rinsing process.

4. The method of claim 2, further comprising removing a rinsing liquid from the rinsing process by treating the wafer with isopropyl alcohol, wherein the liquid to be removed is the isopropyl alcohol.

5. The method of claim 1, wherein the first solid film surrounds and covers the high aspect ratio features.

6. The method of claim 1, further comprising:
providing a surface of a second wafer with a plurality of high aspect ratio features disposed at the surface of the second wafer, the surface of the second wafer comprising the liquid to be removed with the drying process;

in the first processing chamber, replacing the liquid with a second solid film, the second solid film covering the surface of the second wafer;

transferring the second wafer from the first processing chamber to a second processing chamber; and processing the second wafer in the second processing chamber by flowing a supercritical fluid through the second processing chamber, wherein the supercritical fluid removes the second solid film.

7. The method of claim 6, wherein the first wafer and the second wafer are simultaneously processed in the second processing chamber, wherein the second wafer is removed after the depressurizing of the second processing chamber and the stopping of the flow of the supercritical fluid to the second processing chamber.

8. A method for wafer drying, the method comprising:
providing a surface of a first wafer with a plurality of high aspect ratio features disposed at the surface of the first wafer, the surface of the first wafer comprising a liquid to be removed with a drying process;

forming a first solid film covering the surface of the first wafer in a first processing chamber;

transferring the first wafer from the first processing chamber to a second processing chamber;

flowing a fluid within the second processing chamber;

pressurizing the fluid to flow through the second processing chamber in a supercritical phase;

removing, in the second processing chamber, the first solid film from the surface of the first wafer by sublimating the first solid film into the supercritical phase of the fluid;

purging the fluid from the second processing chamber; and removing the first wafer from the second processing chamber after depressurizing the second processing chamber and stopping the flow of the fluid to the second processing chamber.

9. The method of claim 8, further comprising:
before forming the first solid film, performing a rinsing process step on the plurality of high aspect ratio features disposed at the surface of the first wafer.

10. The method of claim 9, wherein the liquid to be removed is a rinsing liquid from the rinsing process.

11. The method of claim 9, further comprising removing a rinsing liquid from the rinsing process by treating the wafer with isopropyl alcohol, wherein the liquid to be removed is the isopropyl alcohol.

12. The method of claim 8, wherein the first solid film surrounds and covers the high aspect ratio features.

13. The method of claim 8, further comprising:
providing a surface of a second wafer to be dried with a plurality of high aspect ratio features disposed at the surface of the second wafer;

forming a second solid film covering the surface of the second wafer in the first processing chamber; and removing the second solid film from the surface of the second wafer by sublimating the second solid film into the supercritical phase of the fluid.

14. The method of claim 13, wherein the first wafer and the second wafer are simultaneously processed in the second processing chamber.

15. The method of claim 8, further comprising:
processing the surface of the first wafer with a liquid before forming the first solid film, wherein forming the first solid film replaces the liquid with the first solid film.

16. The method of claim 1, wherein a width to height ratio of the high aspect ratio features ranges from 1:5 to 1:100.

17. The method of claim 8, wherein a width to height ratio of the high aspect ratio features ranges from 1:5 to 1:100.

18. A method for wafer drying, the method comprising:
providing a surface of a first wafer with a first plurality of features disposed at the surface of the first wafer;

providing a surface of a second wafer with a second plurality of features disposed at the surface of the second wafer, the surface of the first and the second wafers comprising a liquid to be removed with a drying process, wherein a width to height ratio of the first and the second plurality of features ranges from 1:5 to 1:100;

in a first processing chamber, replacing the liquid over the first wafer with a first solid film and replacing the liquid over the second wafer with a second solid film, the first solid film covering the surface of the first wafer and the second solid film covering the surface of the second wafer;

transferring the first and the second wafers from the first processing chamber to a second processing chamber;

processing the first wafer and the second wafer in the second processing chamber by flowing a supercritical fluid through the second processing chamber, wherein the supercritical fluid removes the first solid film and the second solid film progressively;

purging the supercritical fluid from the second processing chamber; and removing the first wafer and the second wafer from the second processing chamber after depressurizing the second processing chamber and stopping the flow of the supercritical fluid to the second processing chamber.

* * * * *